United States Patent
Tsukihara et al.

(12)

(10) Patent No.: US 6,635,889 B2
(45) Date of Patent: Oct. 21, 2003

(54) ION IMPLANTATION APPARATUS SUITED FOR LOW ENERGY ION IMPLANTATION AND TUNING METHOD FOR ION SOURCE SYSTEM THEREOF

(75) Inventors: Mitsukuni Tsukihara, Ehime (JP); Mitsuaki Kabasawa, Saijo (JP); Yuji Takahashi, Ehime (JP); Michiro Sugitani, Niihama (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 66 days.

(21) Appl. No.: 10/050,843

(22) Filed: Jan. 18, 2002

(65) Prior Publication Data

US 2002/0096650 A1 Jul. 25, 2002

(30) Foreign Application Priority Data

Jan. 19, 2001 (JP) .......................................... 2001-12248

(51) Int. Cl.[7] .......................... H01J 37/08; H01J 37/317
(52) U.S. Cl. ................................ 250/492.2; 250/423 R
(58) Field of Search ..................................... 250/492.21

(56) References Cited

U.S. PATENT DOCUMENTS 5,026,997 A * 6/1991 Benvenisti ................ 250/492.2
6,501,078 B1 * 12/2002 Ryding et al. .......... 250/423 R

FOREIGN PATENT DOCUMENTS

JP      3-263748      11/1991
JP      7-169433      7/1995

* cited by examiner

Primary Examiner—John R. Lee
Assistant Examiner—James J Leybourne
(74) Attorney, Agent, or Firm—Arent Fox Kintner Plotkin & Kahn

(57) ABSTRACT

An ion implantation apparatus includes an ion source for generating ions, an extraction electrode for extracting the ions from the ion source by the action of an extraction electric field, and a mass analysis magnet for deflecting or bending the trajectory of an ion beam extracted by the extraction electrode. The ions that have passed through the mass analysis magnet are implanted into a target. The ion implantation apparatus further includes a multi-axis driving mechanism for moving the ion source. The multi-axis driving mechanism changes the relative positional relationship between the ion source and the extraction electrode.

20 Claims, 9 Drawing Sheets

ION IMPLANTATION APPARATUS SUITED FOR LOW ENERGY ION IMPLANTATION AND TUNING METHOD FOR ION SOURCE SYSTEM THEREOF

BACKGROUND OF THE INVENTION

The present invention relates to an ion implantation apparatus and a tuning method for an ion source system thereof.

In recent ion implantation apparatuses, with the shrinking of semiconductor devices, the energy level for implanting ions is being lowered to reduce the depth of ion implantation. In a lower energy range, however, the extraction voltage from an ion source is lower. This has been causing ion extraction efficiency to deteriorate and ion beams to repel one another due to the electric charges thereof with consequent divergence of ion beams, which is known as space charge effect. Hence, there has been a problem in that the degraded transporting efficiency prevents sufficient implantation ion beam current from being obtained.

The above problem will be described with reference to the accompanying drawings.

FIG. 1 shows the construction of a beam line from an ion source of an ion implantation apparatus to a mass analysis slit. In FIG. 1, an ion beam 5 extracted from an ion source 1 through the intermediary of an extraction electrode 2 is subjected to the mass analysis by a mass analysis magnet 3 and a mass analysis slit 4 located at downstream side of the mass analysis magnet 3 thereby to select only required ion species.

FIG. 2 shows the construction of the extraction unit of the ion source used with the ion implantation apparatus. The descriptions will be given of an ion source for taking out ions carrying positive electric charges. In FIG. 2, a positive voltage is being applied to an entire ion source 6. The distal end portion of the ion source 6 has an arc chamber 7 for generating plasma 8. The arc chamber 7 includes an opening 8a for extracting ions from the plasma 8.

Although not shown in FIG. 2, a magnet or a source magnet that acts to generate a magnetic field for efficiently generating plasma in the arc chamber 7 is installed outside the arc chamber 7.

The extraction electrode for extracting ions is generally constructed by a plurality of electrodes each having a slit. Of the plurality of electrodes, the last-or post-electrode as observed from the ion source 6 is usually referred to as a ground electrode 9. As a whole, ions 13 are extracted from the plasma 8 in the arc chamber 7 by an extraction electric field directed from the positive potential of the ion source 6 to the ground electrode 9. At the same time, the ions are accelerated to a desired level of extracting energy.

A suppression electrode 10 is provided on the upstream side of the ground electrode 9. The suppression electrode 10 is subjected to a negative potential with respect to the ground electrode 9 so as to form a negative voltage barrier. The negative voltage barrier prevents the extraction electric field from inversely accelerating ions, that is, accelerating electrons from the ground electrode 9 toward the ion source 6, while the extraction electric field should accelerate ions from the ion source 6 toward the ground electrode 9. Thus, the suppression electrode 10 serves to form the negative voltage barrier for minimizing the chance of electrons from going out into the extraction electric field.

The extraction electrodes, namely, the suppression electrode 10 and the ground electrode 9, are usually secured by a supporting member to a vacuum chamber or the like that accommodates the extraction electrodes. In FIG. 2, however, the extraction electrodes and the vacuum chamber are separately provided. More specifically, the extraction electrodes are supported by a supporting member 12 connected to a driving mechanism 11. This allows the extraction electrodes to be moved in the longitudinal direction (in the direction of the gap axis), i.e., in the upstream or downstream direction of an ion beam stream, and also in the lateral direction (in the direction of the side axis), i.e., the direction orthogonal to the ion beam stream, thus permitting its positional relationship with the arc chamber 7 to be adjusted. In some cases, adjusting devices for tilt axis adjustment and vertical axis adjustment may be added. The tilt axis adjustment is performed to adjust the tilt angles of the extraction electrodes with respect to a central axis in the same direction as that of the gap axis. The vertical axis adjustment is performed to adjust the vertical movement in the direction orthogonal to the ion beam stream.

FIG. 3 schematically illustrates the electrical potential of the extracting system. In the zone from the ion source to the suppression electrode, an ion 14 is accelerated from an ion source potential 15, which is a high potential, toward a suppression electrode potential 16, which is a low potential. After the suppression electrode potential 16, the ion 14 is decelerated to a ground electrode potential 17. Hence, the ion energy (keV) upon completion of the extracting operation will take the value obtained by multiplying the voltage difference {extraction voltage (kV)} between the positive potential applied to the ion source and the potential of the ground electrode (generally a ground potential) by the valence of the ion.

The ion having the desired energy obtained by passing through the ground electrode is transported to a mass analysis magnet, which is the next destination.

The potential gradient from the ion source to the suppression electrode is known as an extraction electric field, and directly influences the extraction of ions from an arc chamber. As shown in FIG. 2, the zone wherein the extraction electric field acts, i.e., the zone extending from the ion source 6 or the arc chamber 7 to the suppression electrode 10, is referred to as an "extraction gap" for convenience. When the size of the extraction gap is fixed, the gradient of potential becomes more gentle as the extraction voltage decreases. In other words, as the extraction voltage decreases, the extraction electric field becomes lower. On the other hand, when the extraction voltage is fixed, the gradient of potential grows steeper as the size of the extraction gap is reduced, making it possible to increase the extraction electric field.

Thus, the size of the extraction gap is an extremely important factor directly related to the efficiency of extracting ions from an ion source. For this reason, as shown in FIG. 2, the ion extracting system of a typical ion implantation apparatus has the driving mechanism 11 for moving the extraction electrode thereby to permit the adjustment of the size of the extraction gap. A gap axis is used primarily for adjusting the aforesaid extraction electric field. A side axis and a tilt axis are used to make fine adjustment for aligning the direction of an ion beam to be extracted with a design beam axis.

The energy of ions depends upon the voltage difference (extraction voltage) between the positive potential applied to the ion source and the potential of the ground electrode (generally the ground potential). Therefore, to take out low-energy ions, the voltage of the ion source has to be reduced. For example, to extract 80 (keV) ions by monovalent ions, a voltage of 80 (kV) is applied to the ion source. To extract 0.5 (keV) ions by monovalent ions, the voltage of only 0.5 (kV) can be applied to the ion source.

If the voltage applied to the ion source is decreased with the extraction gap size remaining unchanged, the extraction electric field applied to the extraction gap weakens. As a result, the ion extraction efficiency deteriorates with a consequent reduction in ion current that can be taken out. To avoid this, when low-energy ions are extracted, adjustment is performed by the driving mechanism to reduce the size of the extraction gap so as to bring the suppression electrode and the ground electrode closer to the ion source. In other words, the deterioration in the extraction efficiency is compensated for by controlling the weakening of the extraction electric field.

Ions are characterized by their tendency to repel each other because of their own positive electric charges and consequently diverge. The phenomenon in which the ions diverge due to their own electric charges is known as the space-charge effect. For the same ions and the same electric current, the space-charge effect is intensified at lower energy. Because of the diverging phenomenon, as the energy level becomes lower, the loss of ions increases when the ions advance for the same distance while diverging. This means that the ion beam transporting efficiency degrades. A shorter distance between the extraction electrodes and the mass analysis magnet is better to effectively transport the ion beam extracted from the ion source to the mass analysis magnet.

As described above, however, the suppression electrode and the ground electrode are moved toward the ion source so as to make up for the deterioration in the efficiency for extracting from the ion source caused by lower energy. This poses a problem in that the distance for transporting lower energy ions is inevitably increased. The distance over which the low energy ions are transported is defined as the distance from the ground electrode to the mass analysis magnet. The distance is denoted by A in FIG. 1.

As previously described, narrowing the extraction gap, i.e., the distance between the ion source and the extraction electrodes, results in the undesirable side effect of deteriorated efficiency of transporting the low-energy ions from the ground electrode to the mass analysis magnet. This has been preventing efficient acquisition of low-energy ions.

In the ion implantation apparatus, the mass analysis slit is disposed at the point where an ion beam that has left the mass analysis magnet converges, thereby removing ions that have different masses or energy levels. It has been known, however, an undesirable side effect, in which the ion beam converging point is dislocated, results if the suppression electrode and the ground electrode are moved toward the ion source to narrow the extraction gap.

The mass analysis magnet has an intrinsic focal length. Changing the position of the ground electrode, which is the starting point of the transport of an ion beam, will accordingly change the converging point of the ion beam that forms an image again after leaving the mass analysis magnet. This is illustrated in FIG. 4.

FIG. 4 shows the ion having left the ground electrode 19 is subjected to a change in its trajectory by the mass analysis magnet, and carried to a mass analysis slit 20. A solid line 21 denotes the diverging ion beam when the ground electrode 19 is positioned at point B, and the converging point of the ion beam is denoted by point $B_F$. In this case, the position of the converging point substantially coincides with the position of the analysis slit 20. This allows the desired ions to efficiently pass through the analysis slit 20.

The diverging ion beam observed when the ground electrode 19 is positioned at point C is denoted by a dashed line 22, and the converging point of the ion beam is denoted by point $C_F$. In this case, the position of the analysis slit 20 and the converging point $C_F$ do not coincide, so that some of the desired ions collide against portions other than the slit of the analysis slit 20 and therefore are lost.

Thus, the dislocation of the converging point prevents some of the ion beam from passing through the analysis slit 20, causing the ion beam current to reduce. Furthermore, in the operation for optimizing only the extraction efficiency by adjusting the extraction gap, it will be difficult to achieve optimum tuning of the ion implantation apparatus because an increase or decrease in the beam current is added due to the loss of the ion beam in the analysis slit 20.

Furthermore, if the converging point is dislocated, some of the ions having different masses or energy levels that should be separated will remain, causing deteriorated mass resolution.

FIG. 5B shows the state wherein some ions that should be separated pass through the analysis slit because of a dislocated converging point. As illustrated in FIG. 5A, when the converging point substantially coincides with the position of an analysis slit 24, the desired ions are able to efficiently pass through the analysis slit 24, as indicated by solid lines 25. Unwanted ions having different curvature radii cannot pass through the slit 24, so that they are separated from the rest, as indicated by dashed lines 26.

In FIG. 5B, if the converging point is dislocated from the position of the analysis slit 24 due to a change of the position of the ground electrode 23, then some of the unwanted ions that should be separated, as indicated by a dashed line 26, will pass through the analysis slit 24 whereas only the desired ions should pass therethrough.

As described above, the method whereby the ion extraction unit is tuned by moving the extraction electrodes presents the following problem.

A. In the case of low-energy ions, the ion beam transporting distance to the mass analysis magnet increases, with resultant lower ion beam transporting efficiency. This leads to a reduction in the beam current that can be used.

B. The tuning is difficult because the beam current increases or decreases due to a change in the position of the converging point of an ion beam after leaving a mass analysis magnet.

C. The mass resolution degrades also because the position of the converging point of an ion beam changes after leaving the mass analysis magnet.

SUMMARY OF THE INVENTION

Accordingly, it is an object of the present invention to make it easier to obtain ion beam current in a low energy range in an ion implantation apparatus.

To this end, an ion implantation apparatus according to the present invention comprises an ion source for generating ions, and an extraction electrode for extracting ions from the ion source by the action of an extraction electric field. The trajectory of an ion beam extracted by the extraction electrode is deflected or bent by the mass analysis magnet. The ions that have passed through the mass analysis magnet are implanted into a target.

According to an aspect of the present invention, the ion implantation apparatus further includes a first driving mechanism for moving the ion source. With this arrangement, the relative positional relationship between the ion source and the extraction electrode can be changed.

Preferably, the first driving mechanism is capable of displacing the ion source in the direction of a gap axis that is the same direction as an ion beam direction, in a vertical or side axis direction right-angled to the ion beam direction, and in a tilt axis direction at an angle with respect to a central axis in the same direction as the ion beam direction.

The ion implantation apparatus further includes a source magnet for generating a magnetic field in the ion source. Preferably, the first driving mechanism moves, in synchronization with the movement of the ion source, the source magnet in the same direction in which the ion source is moved.

DESCRIPTION OF THE PREFERRED EMBODIMENTS

The present invention is embodied by moving an ion source to adjust the relative positional relationship between an ion source and an extraction electrode assembly.

Figure 6:
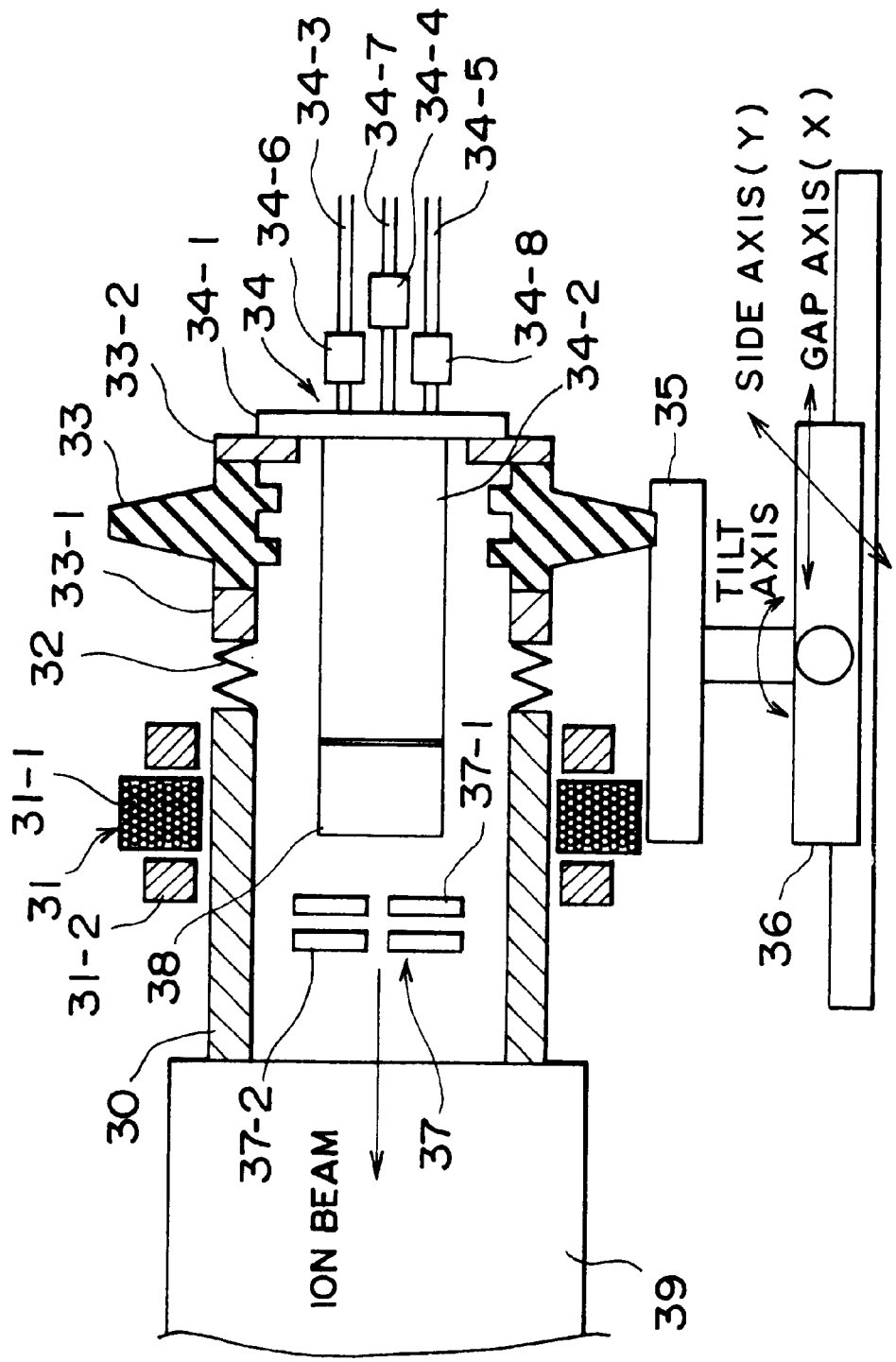
FIG. 6 is a sectional view showing the construction of an essential section of an ion implantation apparatus according to a first embodiment of the present invention.

FIG. 6 shows the construction of an essential section of an ion implantation apparatus according to a first embodiment of the present invention. The ion implantation apparatus according to the first embodiment is used to implant ions into a target, such as a silicon wafer.

The ion implantation apparatus according to the first embodiment includes a vacuum chamber 30, a source magnet 31, a vacuum bellows 32, an insulator 33, an ion source 34 containing an arc chamber 38 for generating plasma, a supporting member 35, a multi-axis driving mechanism 36 (a first driving mechanism), an extraction electrode assembly 37, and a mass analysis magnet 39.

The source magnet 31 is formed of a yoke 31-1 and an electromagnetic coil 31-2. The source magnet 31 generates a magnetic field in the arc chamber 38. The extraction electrode assembly 37 includes a plurality of electrodes each having a slit, and extracts ions from the arc chamber 38. The source magnet 31 and the ion source 34 are supported by the same multi-axis driving mechanism 36 through the intermediary of the supporting member 35. The source magnet 31 and the ion source 34 are moved together by the multi-axis driving mechanism 36 with respect to the vacuum chamber 30 having the extraction electrode assembly 37 therein.

Figure 2:
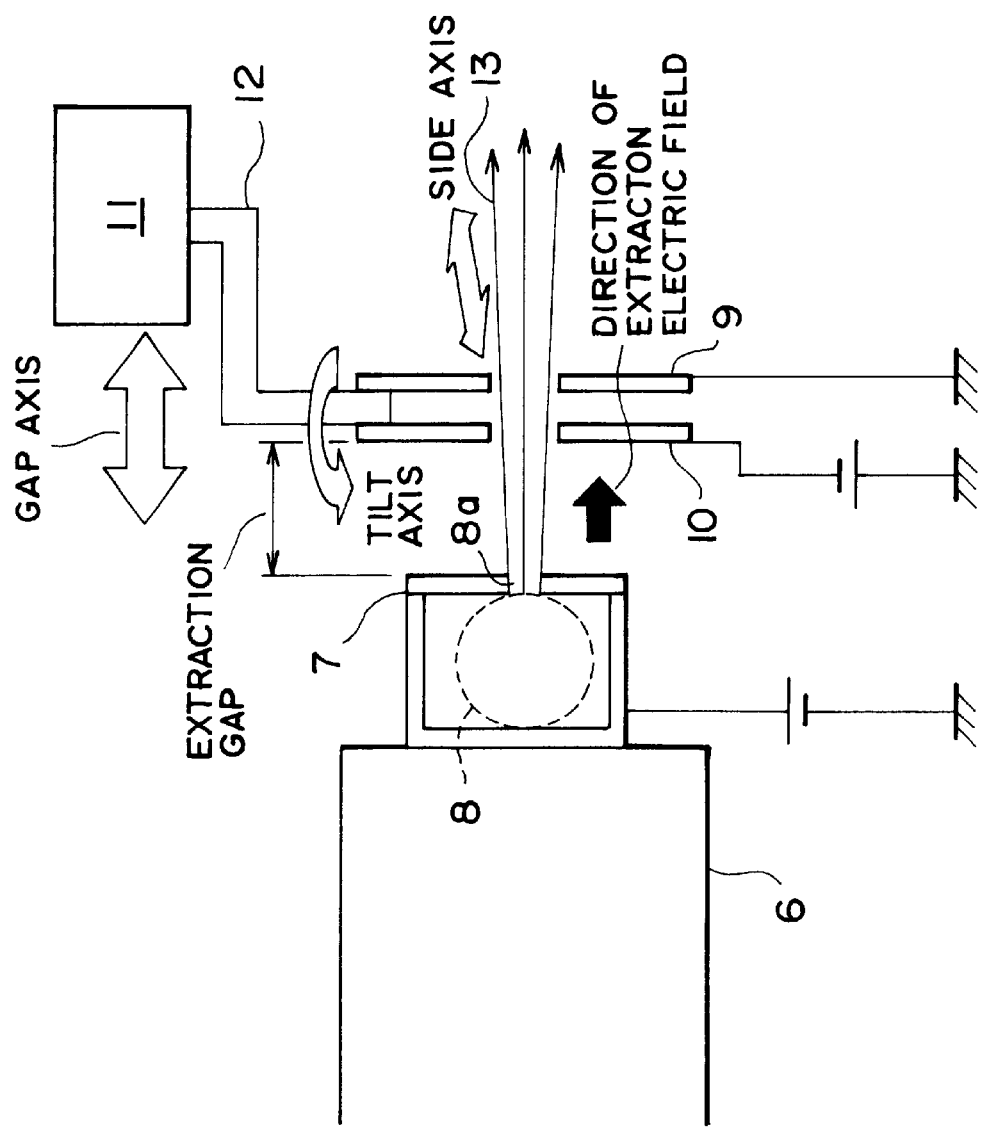
FIG. 2 is an enlarged view of an example in an ion extraction unit of an ion source.
Figure 3:
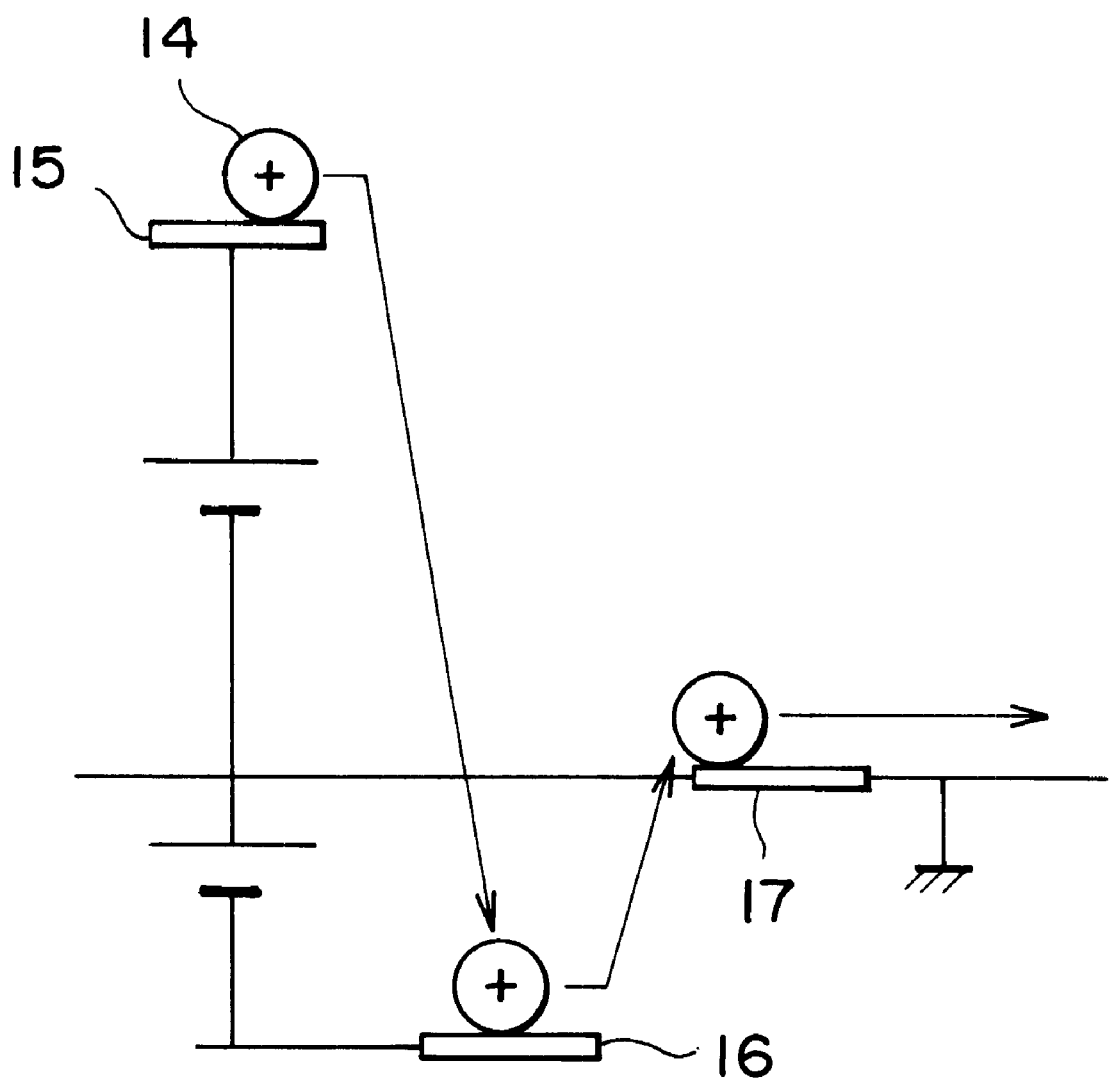
FIG. 3 schematically illustrates an electrical potential in the ion extraction unit shown in FIG. 2.
Figure 4:
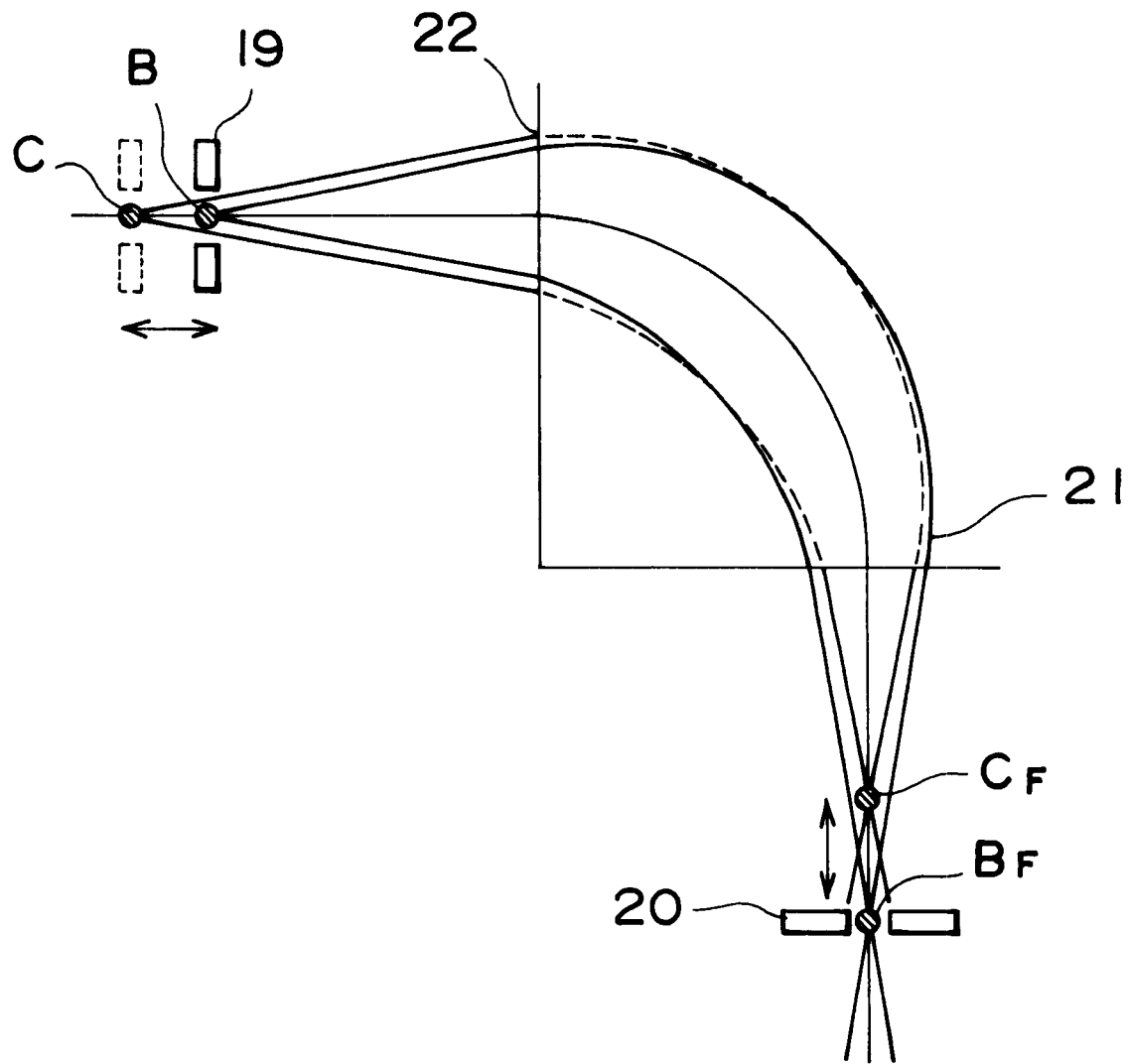
FIG. 4 illustrates an ion beam converging point that moves according to the position of a ground electrode in the ion implantation apparatus.
Figure 5A:
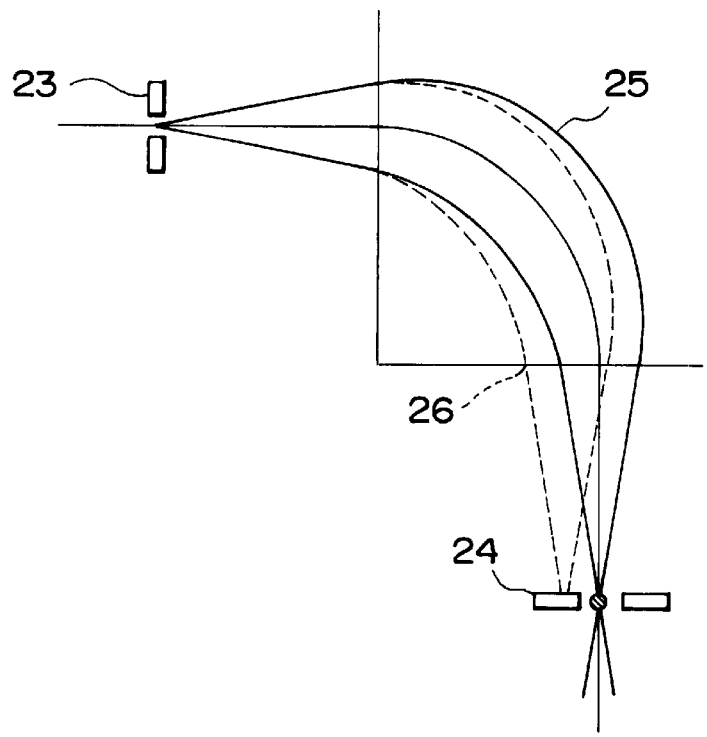
FIG. 5A and FIG. 5B illustrate remaining unwanted ions produced when the converging point does not coincide with an analysis slit in the ion implantation apparatus.
Figure 5B:
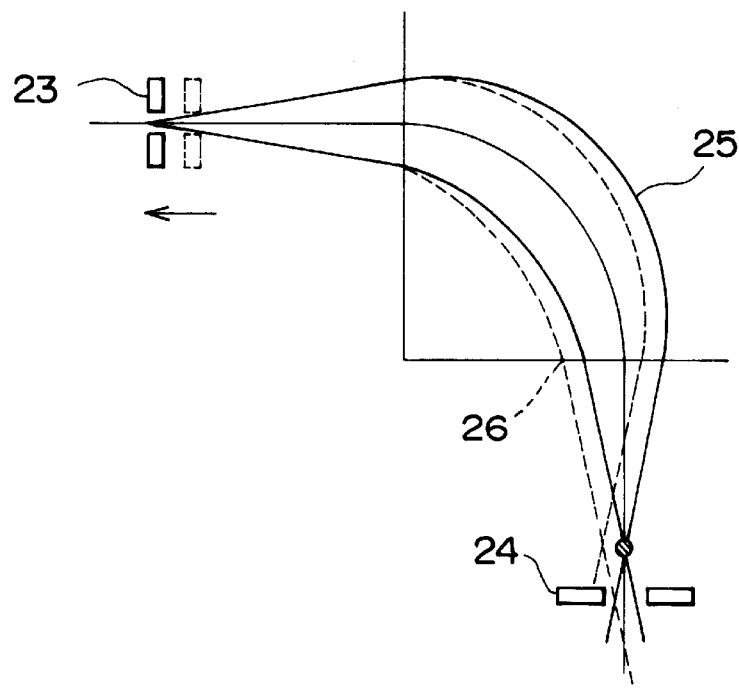

A positive voltage is applied to the entire ion source 34. The arc chamber 38 is formed on the distal end portion of the ion source 34 through the intermediary of a supporting member 34-2. As in the case of the one shown in FIG. 2, the distal end of the arc chamber 38 has an opening for extracting ions from the plasma. The extraction electrode assembly 37 is secured to a supporting member (not shown) in the vacuum chamber 30. As previously mentioned, the extraction electrode assembly 37 is constructed by a plurality of electrodes, including a suppression electrode 37-1 (pre-electrode) located adjacent to the arc chamber 38 and a ground electrode 37-2 (post-electrode), which is the last electrode as observed from the ion source 34. More specifically, although only two electrodes are shown in FIG. 6, at least one intermediate electrode is provided between the suppression electrode and the ground electrode. The extraction electrode assembly 37 may be moved through the intermediary of a supporting member (not shown) rather than fixing the extraction electrode assembly 37. To be more specific, the position of the extraction electrode assembly 37 may be constructed so that it may be adjusted with respect to the arc chamber 38 in the directions of X-axis, Y-axis, and Z-axis that are orthogonal to each other thereby to enhance the freedom of adjustment.

As illustrated, the multi-axis driving mechanism 36 is capable of moving the ion source 34 and the source magnet 31 in the direction of a gap axis (X-axis direction) that is the same direction as an ion beam direction, and also in the tilt axis direction and the side axis direction (Y-axis direction) mentioned above. Although not shown in this embodiment, the multi-axis driving mechanism 36 may have a function for driving the ion source 34 and the source magnet 31 in the vertical direction (Z-axis direction) as previously mentioned.

A cylindrical insulator 33 is attached to a pedestal 34-1 of the ion source 34 through the intermediary of a mounting flange 33-2. The insulator 33 insulates positive voltages applied to the ion source 34. One end of the vacuum bellows 32 is connected to the insulator 33 through the intermediary of a cylindrical joint 33-1. The other end of the vacuum bellows 32 is connected to the end of the vacuum chamber 30 that is adjacent to the ion source 34. The vacuum bellows 32 is flexible to maintain the vacuum in the vacuum chamber 30. The vacuum bellows 32 also imparts sufficient freedom to the ion source 34 so that the ion source 34 can be driven in multiple directions. Obviously, the vacuum bellows 32 may be replaced by another flexible member.

The supporting member 35 supports the source magnet 31 and the insulator 33 thereby to support the entire ion source 34. The arc chamber 38 is attached to the pedestal 34-1 through a supporting member 34-2 that extends toward the inside of the vacuum chamber 30. Furthermore, a gas pipe 34-3, a positive voltage applying electrode member 34-4, a cooling water pipe 34-5 for circulating cooling water within the supporting member 34-2 or the arc chamber 38, etc. are connected to the pedestal 34-1 through the intermediary of flexible units 34-6, 34-7, and 34-8. The gas pipe 34-3 is used to supply a predetermined source gas into the ion source 34. For the reason, the pedestal 34-1 has through holes for pass through the cooling water and the predetermined source gas. It is needless to say that the gas pipe 34-3 and the cooling water pipe 34-5 are connected to the pedestal 34-1 in an electrically insulated condition. An electric wire is connected to the flexible unit 34-7.

Figure 1:
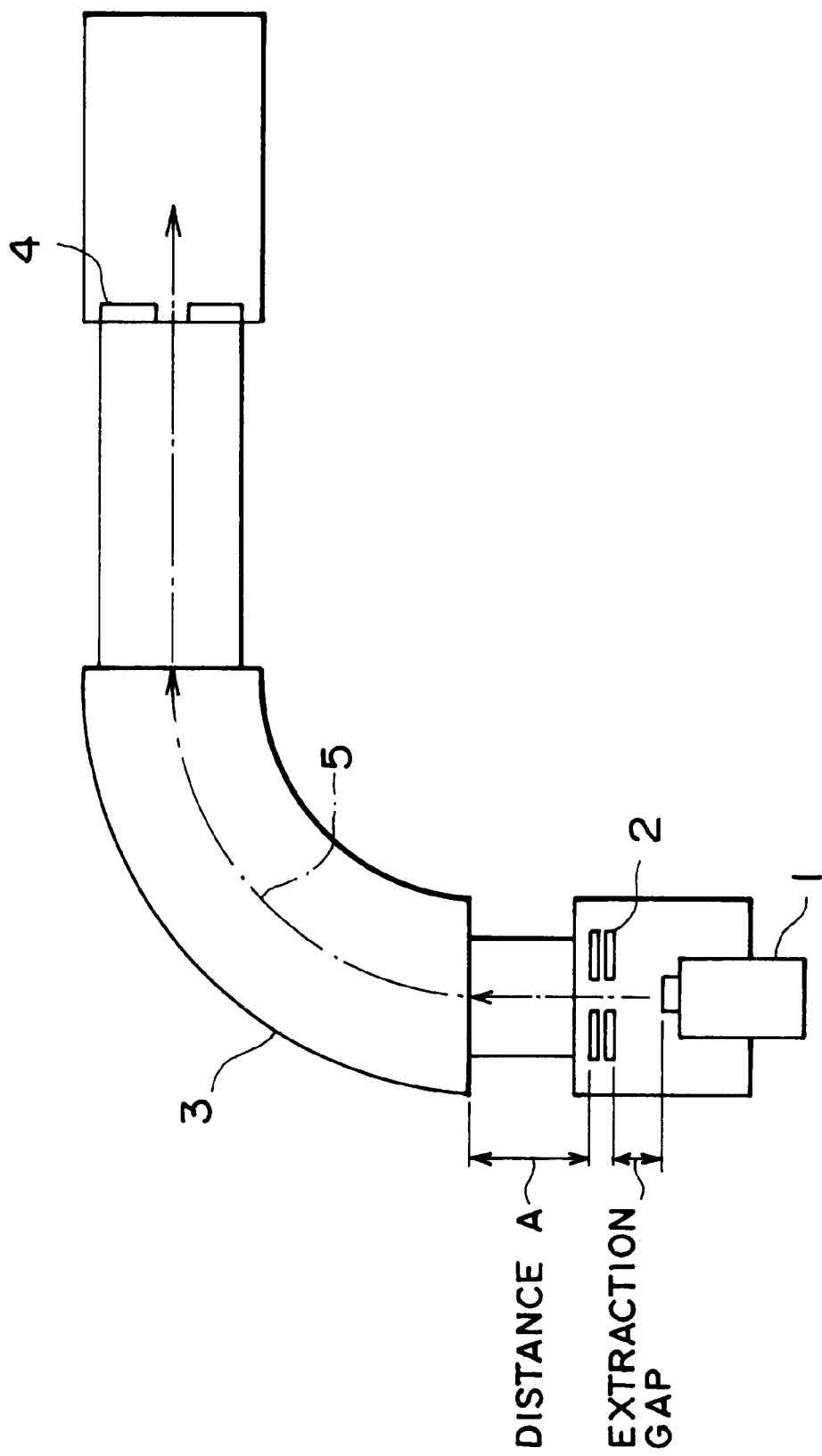
FIG. 1 is a schematic diagram showing a typical ion implantation apparatus.

As described, the vacuum chamber 30 is fixed, and the mass analysis magnet 39 is coupled to the vacuum chamber 30 located on the opposite side of the ion source 34. Although not shown, a device for post acceleration or deceleration is provided on the downstream side from the mass analysis magnet 39. The device may be similar to the analysis slit 4 discussed in relation to FIG. 1.

Figure 7:
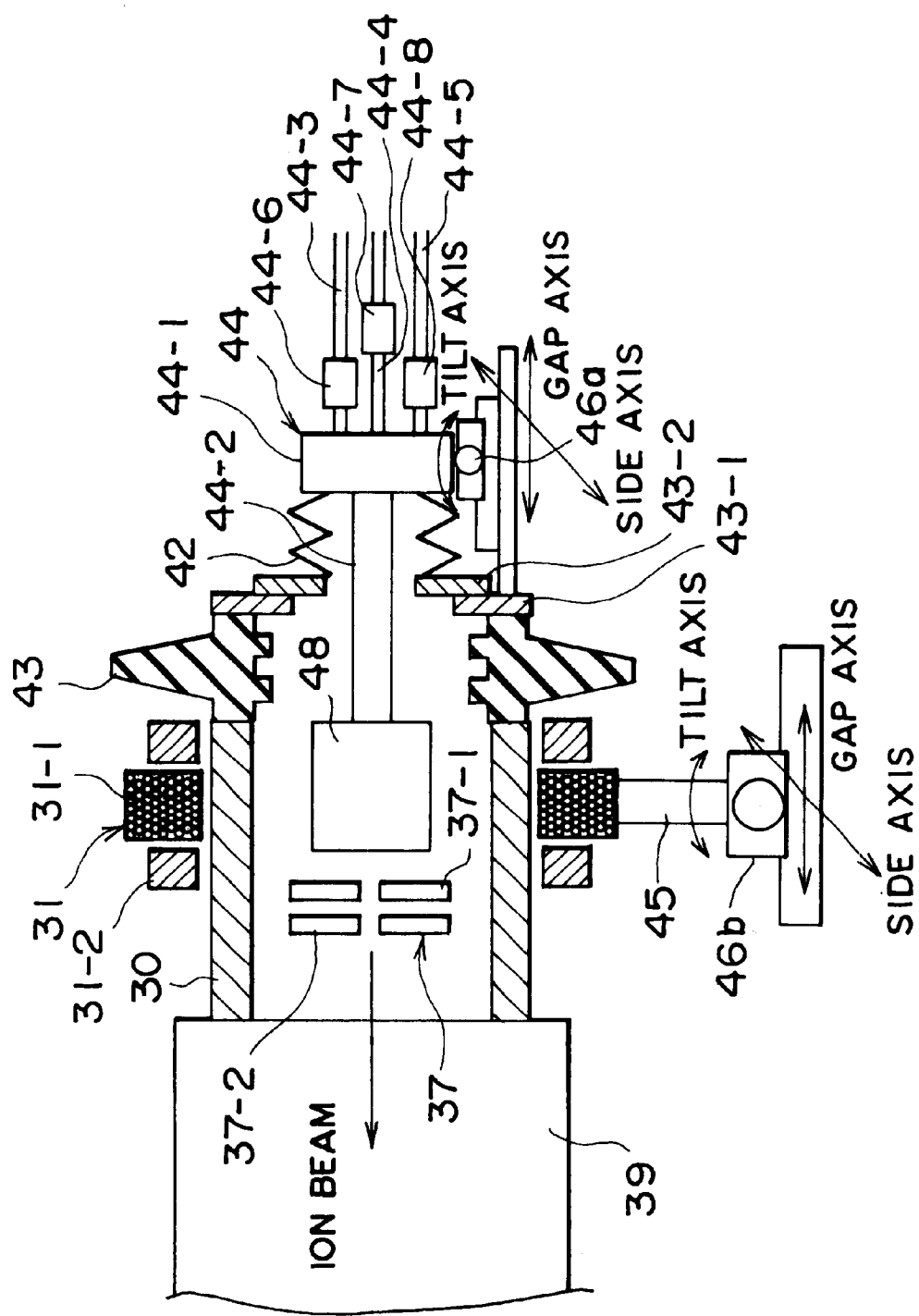
FIG. 7 is a sectional view showing the construction of an essential section of an ion implantation apparatus according to a second embodiment of the present invention.

Referring now to FIG. 7, an ion implantation apparatus according to a second embodiment of the present invention will be described. In FIG. 7, the like components as those shown in FIG. 6 will be assigned like reference numerals. The second embodiment differs from the first embodiment in that an ion source 44 and a source magnet 31 are moved by independent multi-axis driving mechanisms 46a and 46b with respect to a vacuum chamber 30. The ion source 44 has the same function as that of the ion source 34 in the first embodiment, although it is denoted by a different reference numeral from that of the first embodiment.

The multi-axis driving mechanism 46a, which is a first driving mechanism, is capable of moving the ion source 44 in the direction of a gap axis (X-axis direction) that is the same direction as an ion beam direction, and also in the tilt axis direction and the side axis direction (Y-axis direction). Similarly, the multi-axis driving mechanism 46b, which is a second driving mechanism, is capable of moving the source magnet 31 in the direction of the gap axis that is the same direction as the ion beam direction, and also in the tilt axis direction and the side axis direction. Preferably, the multi-axis driving mechanisms 46a and 46b move the ion source 44 and the source magnet 31, respectively, in synchronization at least when moving them in the gap axis direction. In other words, the multi-axis driving mechanisms 46a and 46b preferably move the ion source 44 and the source magnet 31, respectively, for the same distance. In this embodiment also, the multi-axis driving mechanisms 46a and 46b may have the function for driving the ion source 44 and the source magnet 31, respectively, in the vertical direction (the Z-axis direction) as previously mentioned.

The multi-axis driving mechanism 46a supports a pedestal 44-1 of the ion source 44. The multi-axis driving mechanism 46b supports the source magnet 31 through the intermediary of a supporting member 45.

This embodiment maintains the vacuum in the vacuum chamber 30 by the construction described below. A cylindrical insulator 43 is installed on an end of the vacuum chamber 30, which end is adjacent to the ion source 44. One of a flexible vacuum bellows 42 is connected to an end of the insulator 43, which end is adjacent to the ion source 44, through the intermediary of mounting flanges 43-1 and 43-2. The other end of the vacuum bellows 42 is connected to the pedestal 44-1 of the ion source 44. In this embodiment, the ion source 44 is free to move, while the insulator 43 is fixed together with the vacuum chamber 30. The vacuum bellows 42 may be replaced by another type of flexible member.

An arc chamber 48 is attached to the pedestal 44-1 through a supporting member 44-2 that extends toward the inside of the vacuum chamber 30. Furthermore, a gas pipe 44-3 for supplying a predetermined source gas into the ion source 44, a positive voltage applying electrode member 44-4, a cooling water pipe 44-5 for circulating cooling water, etc. are connected to the pedestal 44-1 through the intermediary of flexible units 44-6, 44-7, and 44-8. The pedestal 44-1 has through holes for pass through the cooling water and the predetermined source gas. It is needless to say that the gas pipe 44-3 and the cooling water pipe 44-5 are connected to the pedestal 44-1 in an electrically insulated condition. An electric wire is connected to the flexible unit 44-7.

The mass analysis magnet 39 is coupled to the end of the vacuum chamber 30 at the opposite side of the ion source 44.

In the first and second embodiments, the ion source and the source magnet can be moved by the driving mechanism in the gap axis direction (the X-axis direction), the side axis direction (the Y-axis direction), the tilt axis direction, and the vertical direction (the Z-axis direction). The extraction electrode assembly is completely fixed. Alternatively, however, an arrangement may be made so that the ion source and the source magnet are movable only in the gap axis direction, while the extraction electrode assembly is movable in the side axis direction (the Y-axis direction), the tilt axis direction, and the vertical direction (the Z-axis direction).

Figure 8:
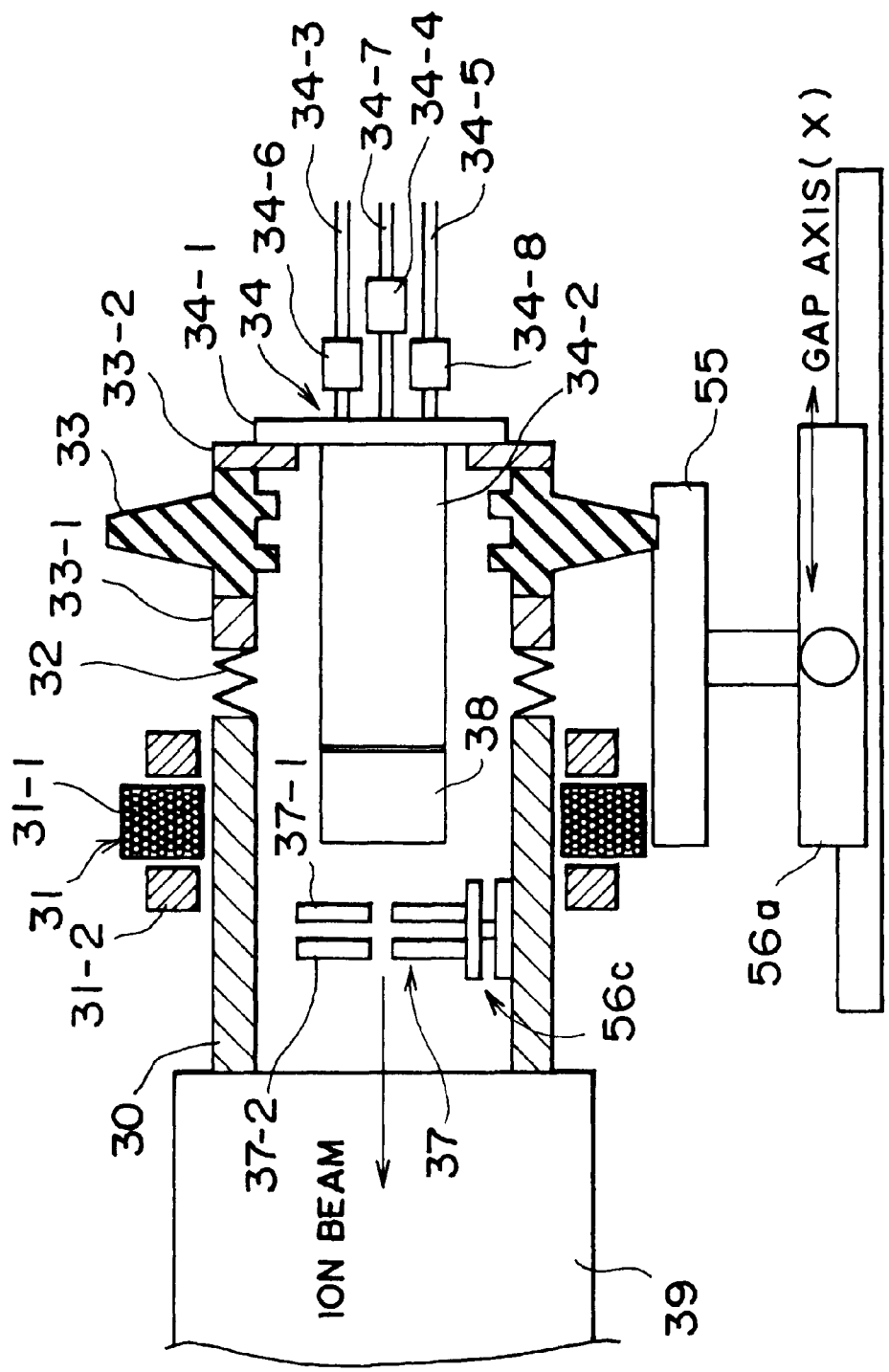
FIG. 8 is a sectional view showing the construction of an essential section of an ion implantation apparatus according to a third embodiment of the present invention.

FIG. 8 shows the construction of an ion implantation apparatus according to a third embodiment of the present invention. In FIG. 8, like components as those shown in FIG. 6 will be assigned like reference numerals. In the ion implantation apparatus according to the third embodiment, an ion source 34 and a source magnet 31 can be moved by a driving mechanism 56a (a first driving mechanism) only in the gap axis direction (X-axis direction). An extraction electrode assembly 37 can be moved in a side axis direction (Y-axis direction) and a tilt axis direction (tilt direction) by a multi-axis driving mechanism 56c (a third driving mechanism) installed in a vacuum chamber 30. The driving mechanism 56a supports the ion source 34 and the source magnet 31 through the intermediary of a supporting member 55. In the third embodiment also, the extraction gap, that is, the gap between the last slit at which the increase or decrease in ion energy finishes (the suppression electrode) and a mass analysis magnet 39 remains unchanged. The third embodiment shares the same functions as those of the first embodiment, except for the driving mechanism 56a and the multi-axis driving mechanism 56b. Obviously, this embodiment can be applied also to the second embodiment. More specifically, to apply the embodiment to the second embodiment, the multi-axis driving mechanism 46a shown in FIG. 7 is replaced by a driving mechanism that allows the ion source 44 to be moved only in the gap axis direction (X-axis direction).

Meanwhile, there has been proposed a method in which another fixed extraction electrode assembly whose relative position remains unchanged with respect to an ion source is attached to the ion source, and the gap between the fixed extraction electrode assembly and the suppression electrode is adjusted by moving the fixed extraction electrode assembly. If, however, such a fixed extraction electrode assembly is used, no available method has been known for adjusting the relative positional relationship between the fixed extraction electrode assembly and the suppression electrode by moving the entire ion source including the fixed extraction electrode assembly.

Figure 9:
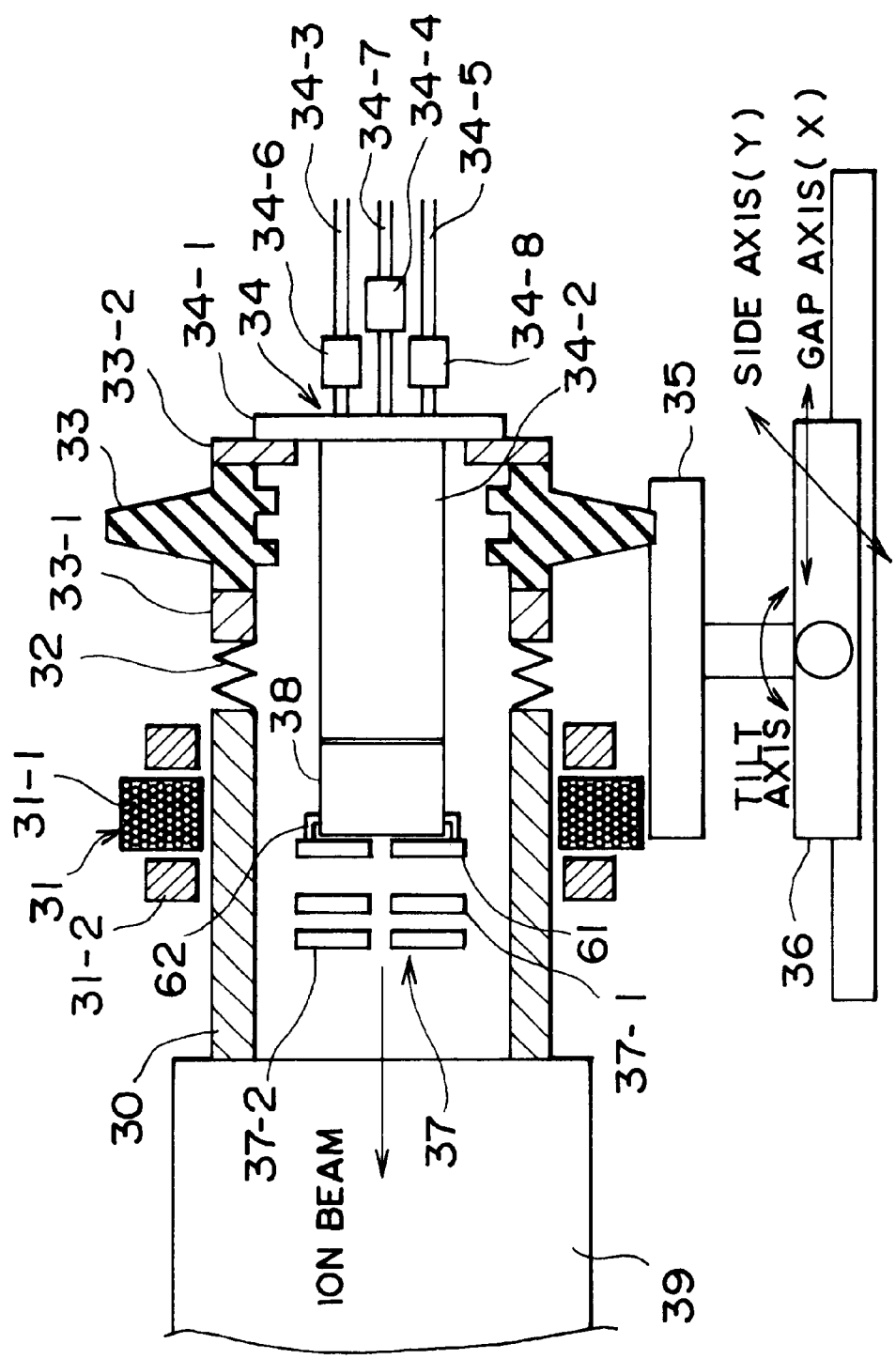
FIG. 9 is a sectional view showing the construction of an essential section of an ion implantation apparatus according to a fourth embodiment of the present invention.

FIG. 9 shows the construction of an ion implantation apparatus according to a fourth embodiment of the present invention. In FIG. 9, like components as those shown in FIG. 6 will be assigned like reference numerals. In the ion implantation apparatus according to the fourth embodiment, a fixed extraction electrode 61 is installed at the distal end of an arc chamber 38 with a gap provided therebetween. The fixed extraction electrode 61 is mounted on the arc chamber 38 through the intermediary of a supporting member 62. A multi-axis driving mechanism 36 moves an entire ion source 34 including the fixed extraction electrode 61 in a gap axis direction (X-axis direction), a side axis direction (Y-axis direction), and a tilt axis direction, making it possible to achieve a further stable ion extracting system. Moreover, when the ion source is moved, the adjustment of an ion beam can be smoothly accomplished. In some cases, two or more fixed extraction electrodes 61 are provided. The operations of the fourth embodiment are the same as those of the first embodiment except for the fixed extraction electrode 61. In this embodiment also, the multi-axis driving mechanism 36 may have a mechanism capable of moving the ion source also in the foregoing vertical direction (the Z-axis direction), as the multi-axis driving mechanism 36. It is needless to say that this embodiment can be applied also to the second embodiment.

The driving force for moving the ion source must be sufficiently large to repel the vacuum force acting on the entire vacuum chamber. For this reason, it is important to minimize the sectional area of the vacuum bellows constituting part of the vacuum chamber in order to reduce the vacuum force.

The present invention has been described with reference to several embodiments explained above. The present invention can be modified as set forth below.

To move only an ion source unit in a vacuum chamber, the vacuum chamber includes an ion source, an extraction electrode, and a vacuum joint box (an evacuation unit) joined to a mass analysis magnet.

Only the ion source is provided in the vacuum chamber to move the ion source together with the entire vacuum chamber. Furthermore, a vacuum box serving as a vacuum joint (evacuator) to an extraction electrode and a mass analysis magnet is provided, and the vacuum chamber and the vacuum joint box are coupled by a movable joint, such as vacuum bellows.

A vacuum chamber is divided into a vacuum chamber compartment adjacent to an ion source and a vacuum chamber compartment adjacent to an extraction electrode, and vacuum bellows is provided between the two vacuum chamber sections.

In a vacuum chamber, only an ion source or arc chamber is supported so that it may be moved in the vacuum chamber. Flexible pipes are used for a gas pipe and a cooling water pipe, a flexible wire is used for an electrode, and only a minimum of an ion source member is moved.

In the ion implantation apparatuses according to the present invention, the extraction gap (the distance between the ion source and the extraction electrode assembly) is adjusted by moving the ion source thereby to compensate for the deterioration in the ion beam extraction efficiency caused by a reduced extraction voltage. With this arrangement, the ion beam transport distance from the extraction electrode assembly to the mass analysis magnet can be maintained at a fixed distance, so that the size of the extraction gap can be reduced without the need for increasing the ion beam transport distance. As a result, high ion beam transporting efficiency can be maintained, permitting greatly increment in the current value of an ion beam that has been taken out.

Especially for low-energy ions, high ion beam transporting efficiency can be maintained by moving an ion source with respect to an extraction electrode so as to adjust the extraction gap. This makes it possible to compensate for a considerable deterioration and reduction in the low-energy ion extraction efficiency and beam current, thus allowing the current value of a low-energy ion beam to be greatly increased.

In the ion implantation apparatus according to the present invention, the distance between the ground electrode of the extraction electrode assembly and the mass analysis magnet remains unchanged. This means that the position of the converging point of the ion beam after leaving the mass analysis magnet remains fixed. The arrangement restrains an increase or decrease in beam current caused by a change in the position of the converting point of an ion beam after leaving the mass analysis magnet. This permits easier tuning of the entire ion implantation apparatus.

In the ion implantation apparatus according to the present invention, the position of the converting point of the ion beam after leaving the mass analysis magnet remains unchanged. It is possible, therefore, to restrain the mass resolution from degrading due to a change in the position of the converging point of the ion beam after leaving the mass analysis magnet. This arrangement permits reduced energy-dependence of the mass resolution of ions extracted from an ion source.

What is claimed is:

1. An ion implantation apparatus comprising an ion source for generating ions, an extraction electrode for extracting ions from the ion source by the action of an extraction electric field, and a mass analysis magnet for deflecting or bending the trajectory of an ion beam extracted by the extraction electrode, the ions that have passed through the mass analysis magnet being implanted into a target, wherein the ion implantation apparatus further comprises a first driving mechanism for moving the ion source thereby to change the relative positional relationship between the ion source and the extraction electrode.

2. The ion implantation apparatus according to claim 1, wherein the first driving mechanism is capable of displacing the ion source in the direction of a gap axis, which is the same direction of the ion beam, a vertical direction and/or the direction of a side axis, which is right-angled to the direction of the ion beam, and the direction of a tilt axis at an angle with respect to a central axis in the same direction as the direction of the ion beam.

3. The ion implantation apparatus according to claim 1, further comprising a source magnet for generating a magnetic field in the ion source, wherein the first driving mechanism moves, in synchronization with the movement of the ion source, the source magnet in the same direction in which the ion source moves.

4. The ion implantation apparatus according to claim 1, wherein at least one fixed extraction electrode whose relative position with respect to the ion source remains unchanged is provided in the ion source, and the first driving mechanism moves the ion source that includes the fixed extraction electrode thereby to adjust the relative positional relationship between the extraction electrode and the ion source.

5. The ion implantation apparatus according to claim 1, wherein the extraction electrode includes a plurality of electrodes each having a slit; and the distance from the last electrode slit, at which the energy of an ion finishes increasing or decreasing when the ion is extracted, to the mass analysis magnet remains unchanged.

6. The ion implantation apparatus according to claim 1, further comprising a mechanism for post acceleration or post deceleration that is located on the downstream side from the mass analysis magnet.

7. The ion implantation apparatus according to claim 1, further comprising:
   a source magnet for generating a magnetic field in the ion source; and
   a second driving mechanism for moving the source magnet independently from the movement of the ion source.

8. The ion implantation apparatus according to claim 1, further comprising:
   at least one fixed extraction electrode whose relative position with respect to the ion source remains unchanged is provided in the ion source,
   wherein the first driving mechanism moves the ion source that includes the fixed extraction electrode thereby to adjust the relative positional relationship between the extraction electrode and the ion source.

9. The ion implantation apparatus according to claim 1, wherein
   the extraction electrode includes a plurality of electrodes each having a slit; and
   the distance from the last electrode slit, at which an increase or decrease in the energy of an ion when the ion is extracted finishes, to the mass analysis magnet remains unchanged.

10. The ion implantation apparatus according to claim 1, further comprising a mechanism for post acceleration or post deceleration located on the downstream side from the mass analysis magnet.

11. The ion implantation apparatus according to claim 1, wherein
   the first driving mechanism has a third driving mechanism that allows the ion source to be moved only in the direction of a gap axis, which is the same direction of the ion beam, and
   the third driving mechanism moves the extraction electrode in a vertical direction and/or the direction of a side axis, which is right-angled to the direction of the ion beam, and adjusts the tilt of the extraction electrode.

12. The ion implantation apparatus according to claim 11, further comprising a source magnet for generating a magnetic field in the ion source,
   wherein the first driving mechanism moves, in synchronization with the movement of the ion source, the source magnet in the same direction in which the ion source moves.

13. The ion implantation apparatus according to claim 12, wherein
   at least one fixed extraction electrode whose relative position with respect to the ion source remains unchanged is provided in the ion source, and
   the first driving mechanism moves the ion source that includes the fixed extraction electrode thereby to adjust the relative positional relationship between the extraction electrode and the ion source.

14. The ion implantation apparatus according to claim 13, wherein
   the extraction electrode includes a plurality of electrodes each having a slit; and
   the distance from the last electrode slit, at which an increase or decrease in the energy of an ion when the ion is extracted finishes, to the mass analysis magnet remains unchanged.

15. The ion implantation apparatus according to claim 14, further comprising a mechanism for post acceleration or post deceleration that is located on the downstream side from the mass analysis magnet.

16. The ion implantation apparatus according to claim 11, further comprising:
   a source magnet for generating a magnetic field in the ion source; and
   a second driving mechanism for moving the source magnet independently from the movement of the ion source.

17. The ion implantation apparatus according to claim 16, further comprising:
   at least one fixed extraction electrode whose relative position with respect to the ion source remains unchanged is provided in the ion source,
   wherein the first driving mechanism moves the ion source that includes the fixed extraction electrode thereby to adjust the relative positional relationship between the extraction electrode and the ion source.

18. The ion implantation apparatus according to claim 17, wherein
   the extraction electrode includes a plurality of electrodes each having a slit; and
   the distance from the last electrode slit, at which an increase or decrease in the energy of an ion when the ion is extracted finishes, to the mass analysis magnet remains unchanged.

19. A tuning method of an ion source system for use in an ion implantation method comprising the steps of generating ions by an ion source, extracting the ions from the ion source by the action of an extraction electric field of an extraction electrode assembly including a plurality of electrodes, deflecting the trajectory of an extracted ion beam by a mass analysis magnet, and implanting the ions that have passed through the mass analysis magnet into a target, wherein:
   the ratio of the interval between an ion source and a pre-electrode in the extraction electrode assembly to the interval between a post-electrode in the extraction electrode assembly and the mass analysis magnet is changed by changing the interval between the ion source and the pre-electrode in the extraction electrode assembly.

20. A tuning method according to claim 19, wherein
   the changing of the interval between the ion source and the pre-electrode in the extraction electrode assembly is executed by a first driving mechanism for moving the ion source.

* * * * *